United States Patent
Hung et al.

(10) Patent No.: US 11,430,761 B2
(45) Date of Patent: Aug. 30, 2022

(54) SEMICONDUCTOR PACKAGE AND METHOD FOR MANUFACTURING THE SAME

(71) Applicant: Advanced Semiconductor Engineering, Inc., Kaohsiung (TW)

(72) Inventors: Yun-Ching Hung, Kaohsiung (TW); Yung-Sheng Lin, Kaohsiung (TW); Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 101 days.

(21) Appl. No.: 16/793,991

(22) Filed: Feb. 18, 2020

(65) Prior Publication Data

US 2021/0257331 A1    Aug. 19, 2021

(51) Int. Cl.
*H01L 23/00*      (2006.01)

(52) U.S. Cl.
CPC .............. *H01L 24/81* (2013.01); *H01L 24/03* (2013.01); *H01L 24/16* (2013.01); *H01L 24/17* (2013.01); *H01L 2224/03827* (2013.01); *H01L 2224/10145* (2013.01); *H01L 2224/11462* (2013.01); *H01L 2224/11827* (2013.01); *H01L 2224/16014* (2013.01); *H01L 2224/16057* (2013.01); *H01L 2224/16148* (2013.01); *H01L 2224/17106* (2013.01); *H01L 2224/81007* (2013.01); *H01L 2224/81232* (2013.01)

(58) Field of Classification Search
CPC ......... H01L 24/81; H01L 24/03; H01L 24/16; H01L 24/17
See application file for complete search history.

(56) References Cited

U.S. PATENT DOCUMENTS

| | | | |
|---|---|---|---|
| 10,332,891 B1 | 6/2019 | Wang | |
| 11,127,711 B2 * | 9/2021 | Shini | ........................ H01L 24/20 |
| 2018/0127263 A1 * | 5/2018 | Tai | ........................ B81B 3/0008 |
| 2020/0035643 A1 * | 1/2020 | Hirata | .................... H01L 23/522 |

OTHER PUBLICATIONS

Yang, Sean et al., "Development of Low-temperature, Pressureless Copper-to-Copper Bonding by Microfluidic Electroless Interconnection Process", 2018 IEEE 68th Electronic Components and Technology Conference, pp. 308-313.

* cited by examiner

*Primary Examiner* — Christine A Enad
(74) *Attorney, Agent, or Firm* — Foley & Lardner LLP

(57) ABSTRACT

Present disclosure provides a semiconductor package, including a first substrate having a first active surface and a first trench recessed from the first active surface, a second substrate having a second trench facing the first trench, and a pathway cavity defined by the first trench and the second trench. The first trench comprises a first metal protrusion and a first insulating protrusion. A method for manufacturing the semiconductor package described herein is also disclosed.

19 Claims, 17 Drawing Sheets

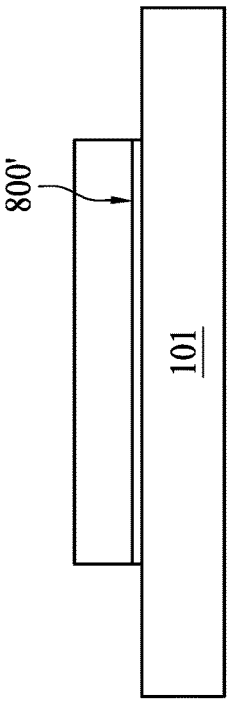
FIG. 8A
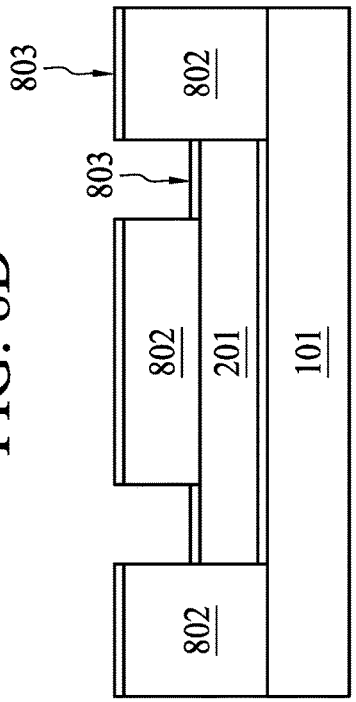
FIG. 8B
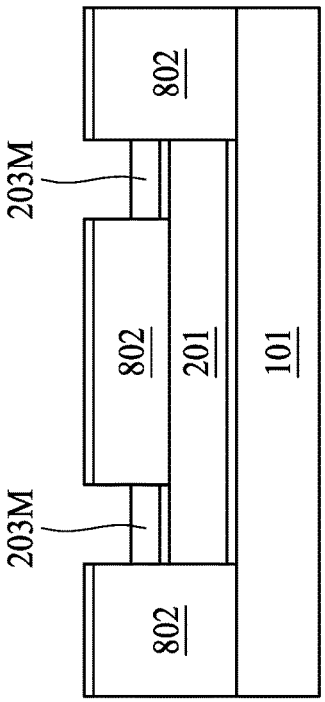
FIG. 8C
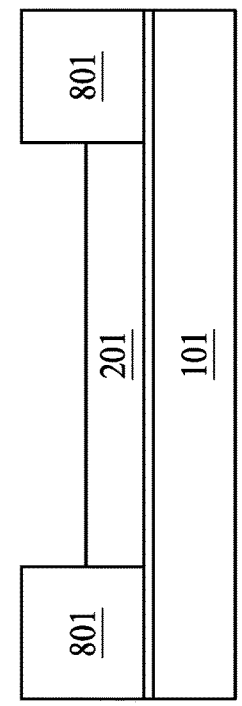
FIG. 8D
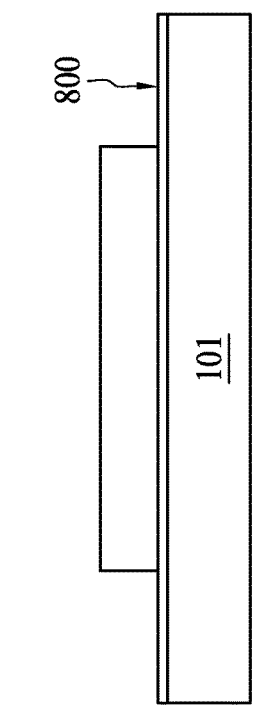
FIG. 8E
FIG. 8F

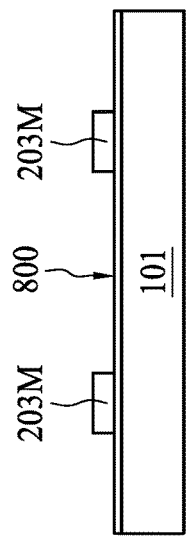
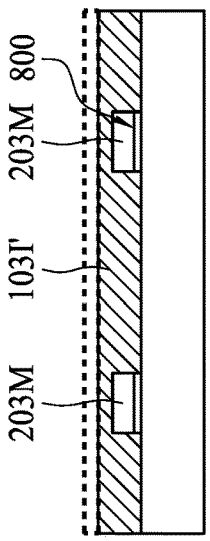
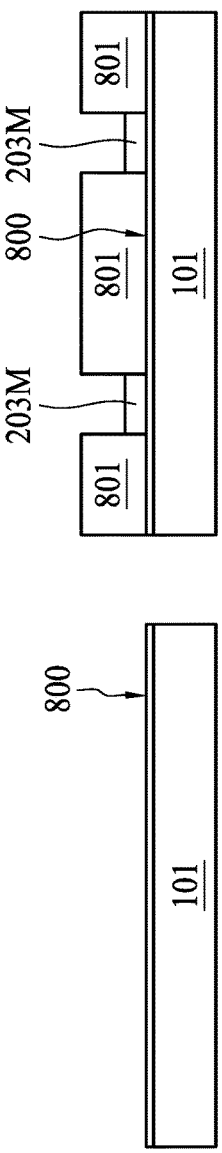
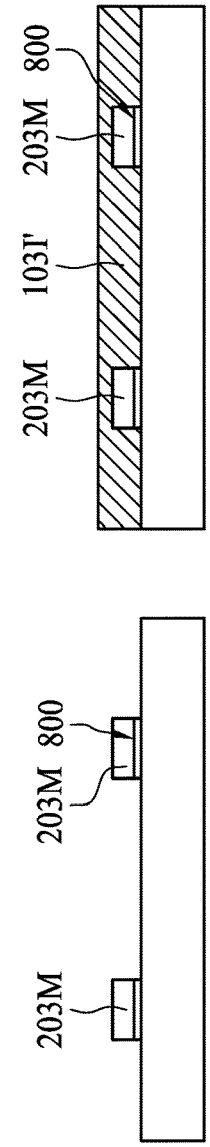
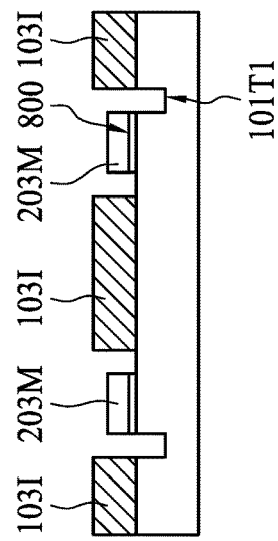

US 11,430,761 B2

SEMICONDUCTOR PACKAGE AND METHOD FOR MANUFACTURING THE SAME

BACKGROUND

1. Technical Field

The present disclosure relates to a semiconductor package having a pathway cavity allowing fluid passing, and a method for manufacturing such semiconductor package.

2. Description of the Related Art

Conventional chip to chip, module to module, chip to wafer, chip to substrate, wafer to wafer bonding requires formation of metal bonding. Specific types of chip or the module, wafer, substrate including such chip may require a low temperature bonding operation to prevent such chip from deteriorated performance. Among low temperature bonding operations, electroless Cu-to-Cu bonding may be an option.

Current electroless Cu-to-Cu bonding applies non-stationary spacers between opposing bonding surfaces in order to create a pathway for electroless plating solution. Nevertheless, the spacers are non-stationary construct therefore could affect the flow of electroless plating solution. In addition, with ever increasing demand of I/O density, lateral bridging frequently occurred in conventional electroless Cu-to-Cu bonding scenario.

SUMMARY

In some embodiments, the present disclosure provides a semiconductor package, including a first substrate having a first active surface and a first trench recessed from the first active surface, a second substrate having a second trench facing the first trench, and a pathway cavity defined by the first trench and the second trench. The first trench comprises a first metal protrusion and a first insulating protrusion.

In some embodiments, the present disclosure provides a semiconductor package, including a first substrate having a first active surface and a first trench recessed from the first active surface, a second substrate having a second trench facing the first trench, a first fluid pathway defined by the first trench and the second trench, and a plurality of conductive elements and a plurality of insulating portions in the first fluid pathway, and each of the conductive elements being staggerly disposed with respect to each of the insulating portions.

In some embodiments, the present disclosure provides a method for manufacturing a semiconductor package, the method including providing a first substrate and a second substrate, forming a first metal protrusion over the first substrate, depositing a first dielectric layer over the first substrate, planarizing the first dielectric layer, forming a first trench in the first substrate and exposing the first metal protrusion, and bonding the first substrate and the second substrate by an electroless plating operation.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 8A to FIG. 8J illustrate cross sectional views of intermediate products in various stages of manufacturing a semiconductor package, according to some embodiments of the present disclosure.

FIG. 10A to FIG. 10G illustrate cross sectional views of intermediate products in various stages of manufacturing a semiconductor package, according to some embodiments of the present disclosure.

DETAILED DESCRIPTION

Figure 1A:
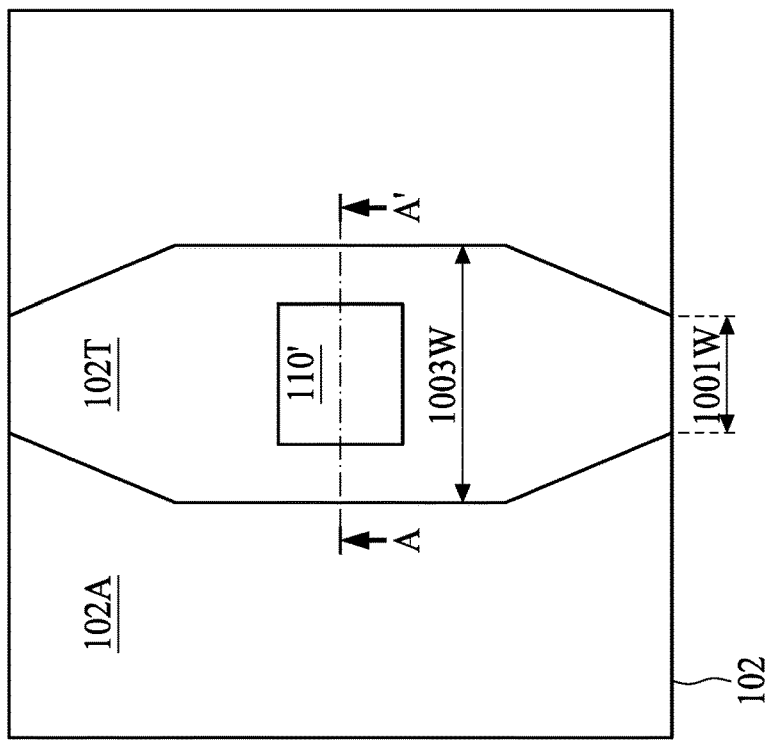
FIG. 1A illustrates a top view of a first substrate in a semiconductor package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Present disclosure provides a semiconductor package structure with metal-to-metal bonding, for example, a Cu-to-Cu bonding, formed by electroless plating operation. Insulative protrusions in the semiconductor package structure provides a stationary construct allowing a defined pathway for the electroless plating solution. The insulative protrusions or insulative portion in the semiconductor package structure is staggerly disposed between adjacent conductive elements, for example, copper pillars or copper pads, and could prevent the adjacent conductive elements from bridging under high I/O count. The conductive elements referred herein includes, but not limited to, copper pillars, copper pads, copper posts, copper protrusions, nickel, gold, palladium, and other suitable conductive materials with variable dimension and geometries known in the art.

Referring to FIG. 1A, FIG. 1A illustrates a top view of a first substrate 10A in a semiconductor package according to some embodiments of the present disclosure. The first substrate 10A includes a substrate body 101 having an active surface 101A, a trench 101T recessed from the active surface 101A. The active surface 101A is in proximity to an active region of the first substrate 10A and may include a dielectric surface. A connector region 110, for example, an I/O region with a plurality of conductive connectors, is located in the trench 101T. As depicted in FIG. 1A, the trench 101T may possess a narrower width 1001W at an edge of the substrate body 101, or an edge of the active surface 101A, and a wider width 1003W at a center of the substrate body 101, or a center of the active surface 101A. In some embodiments, the wider width 1003W of the trench 101T can be closer to the connector region 110 than to the edge. The width variation of the trench 101T may enhance the flow dynamic or flow rate of the fluid, for example, the electroless plating solution.

Figure 1B:
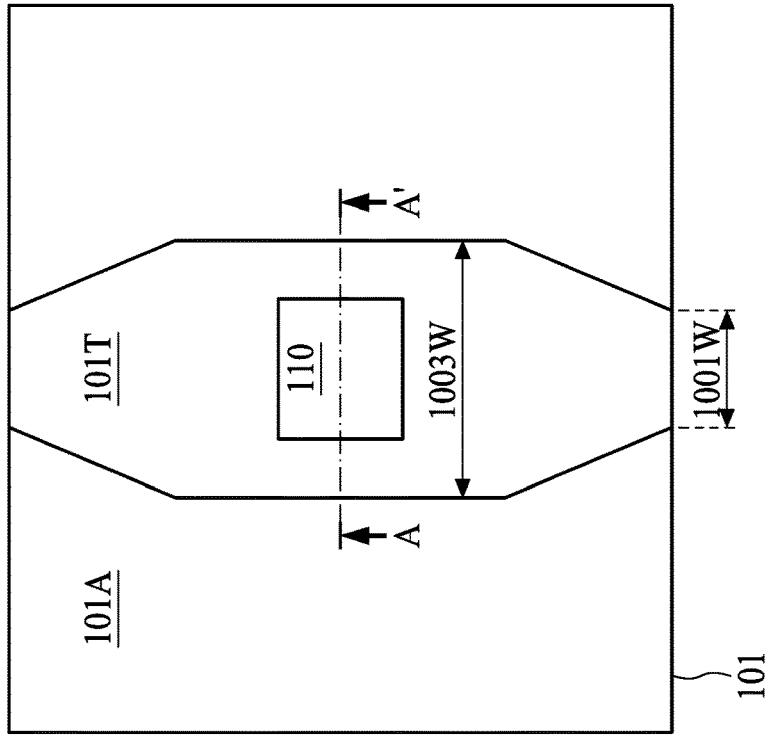
FIG. 1B illustrates a top view of a second substrate in a semiconductor package according to some embodiments of the present disclosure.

Referring to FIG. 1B, FIG. 1B illustrates a top view of a second substrate 10B in a semiconductor package according to some embodiments of the present disclosure. The second substrate 10B includes a substrate body 102 having an active surface 102A, a trench 102T recessed from the active surface 102A. A connector region 110', for example, an I/O region with a plurality of conductive connectors, is located in the trench 102T. As depicted in FIG. 1B, the trench 102T may possess a narrower width 1001W at an edge of the substrate body 102, or an edge of the active surface 102A, and a wider width 1003W at a center of the substrate body 102, or a center of the active surface 102A. In some embodiments, the wider width 1003W of the pathway cavity 107 can be closer to the connector region 110' than to the edge. The width variation of the pathway cavity 107' may enhance the flow dynamic or flow rate of the fluid, for example, the electroless plating solution.

Figure 1C:
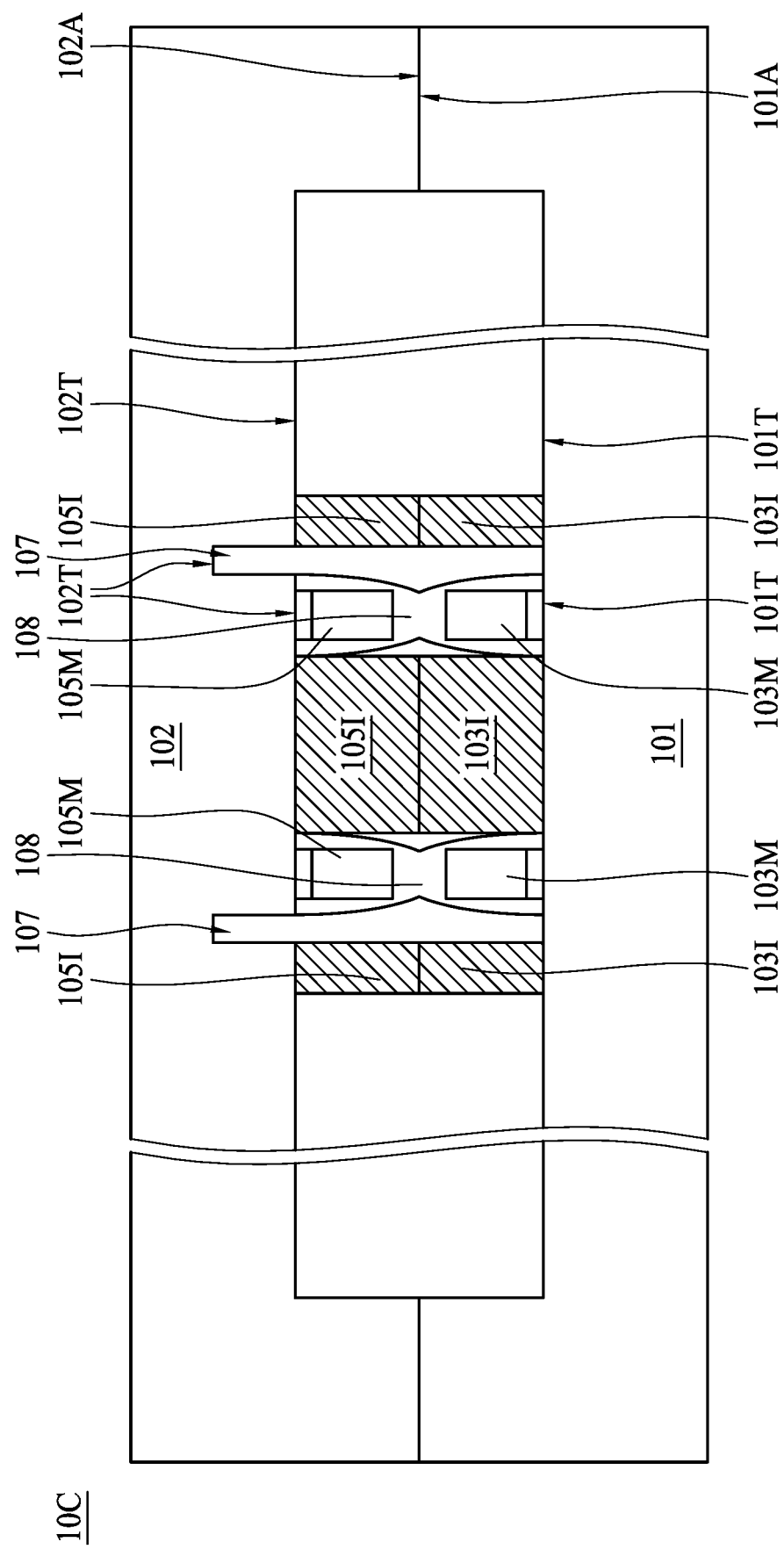
FIG. 1C illustrates a cross-sectional view of a semiconductor package according to some embodiments of the present disclosure.

In some embodiments, the active surface 101A of the first substrate 10A is bonded to the active surface 102A of the second substrate 10B and form a semiconductor package illustrated in FIG. 1C. The trench 101T of the first substrate 10A and the trench 102T of the second substrate 10B define a pathway cavity allowing the fluid, e.g., electroless plating solution, to pass by. The pathway cavity may be referred to as a fluid pathway in the present disclosure since the pathway cavity, in some embodiments, is configured as a fluid pathway during an electroless plating operation.

Referring to FIG. 1C, FIG. 1C illustrates a cross-sectional view of a semiconductor package 10C according to some embodiments of the present disclosure. The semiconductor package 10C is a cross section dissecting along dotted lines AA' of FIG. 1A and FIG. 1B. The first substrate 101 is bonded to the second substrate 102 at the first active surface 101A and the second active surface 102A. The active surface 101A is in proximity to an active region of the first substrate 10A and may include a dielectric surface. The active surface 101B is in proximity to an active region of the second substrate 10B and may include a dielectric surface. In addition, the trench 101T and the trench 102T each recessed from the first active surface 101A and the second active surface 101B, respectively, together form a pathway cavity 107. The semiconductor package 10C includes a plurality of conductive elements, including metal protrusions 103M, 105M, and electroless plated portion 108, and a plurality of insulating portions, including insulating protrusion 103I, 105I. The plurality of conductive elements are staggerly disposed with respect to the plurality of insulating protrusion in the pathway cavity 107. At least one metal protrusions 103M and at least one insulating protrusions 103I are located in the trench 101T of the first substrate 101. As shown in FIG. 1C, the metal protrusion 103M is laterally adjacent to two insulating protrusions 103I, forming a stagger arrangement among the plurality of metal protrusions 103M and the insulating protrusions 103I.

Similarly, at least one metal protrusions 105M and at least one insulating protrusions 105I are located in the trench 102T of the second substrate 102. As shown in FIG. 1C, the metal protrusion 105M is laterally adjacent to two insulating protrusions 105I, forming a stagger arrangement among the plurality of metal protrusions 105M and the insulating protrusions 105I. The metal protrusion 105M is electrically coupled to the metal protrusion 103M through an electroless plated portion 108. In some embodiments, the electroless plated portion 108 may surround a top surface and a side surface of each of the metal protrusion 103M and metal protrusion 105M, and the electroless plated portion 108 at the top surfaces of the opposing metal protrusions are connected so as to form electrical connection. In some embodiments, the top surface of the insulating protrusion 105I is in physical connection to the top surface of the insulating protrusion 103I. A boundary can be observed at the contact interface of the insulating protrusion 105I and the insulating protrusion 103I.

In some embodiments, the recess 101T of the first substrate 101 may have leveled bottom, whereas the recess 102T of the second substrate 102 may have a bottom at different levels. Depending on the layout and depth of the active regions, some of the semiconductor dies may allow a deeper recess toward a passive surface of the substrate, while some of the semiconductor dies may only accommodate a shallower recess toward the passive surface of the substrate. The bottom level of the recesses 101T and 102T may be adjusted according to the active region arrangement of different semiconductor dies. Deeper level of the trench bottom toward the passive surface allows greater volume of the fluid to pass the metal protrusions 103M and 105M during electroless plating operation, so as to facilitate the process especially when high viscosity fluid is used.

Figure 1D:
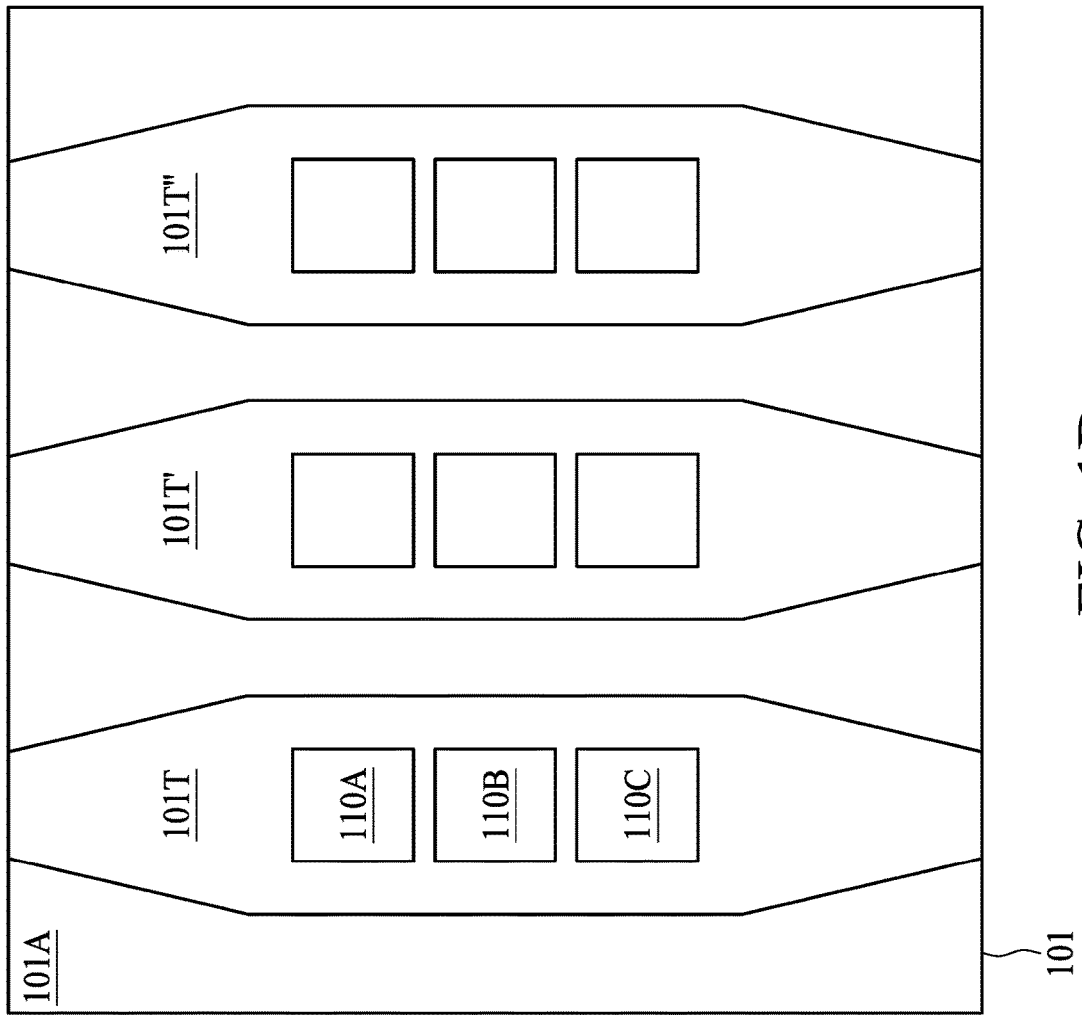
FIG. 1D illustrates a top view of a first substrate in a semiconductor package according to some embodiments of the present disclosure.

Referring to FIG. 1D, FIG. 1D illustrates a top view of a first substrate in a semiconductor package according to some embodiments of the present disclosure. In some embodiments, an active surface 101A of a substrate body 101 may possess more than one trenches 101T, 101T', and 101T". Each of the trenches 101T, 101T', and 101T" may include more than one connector regions 110A, 110B, and 110C, depending on various designs of semiconductor dies.

Figure 2:
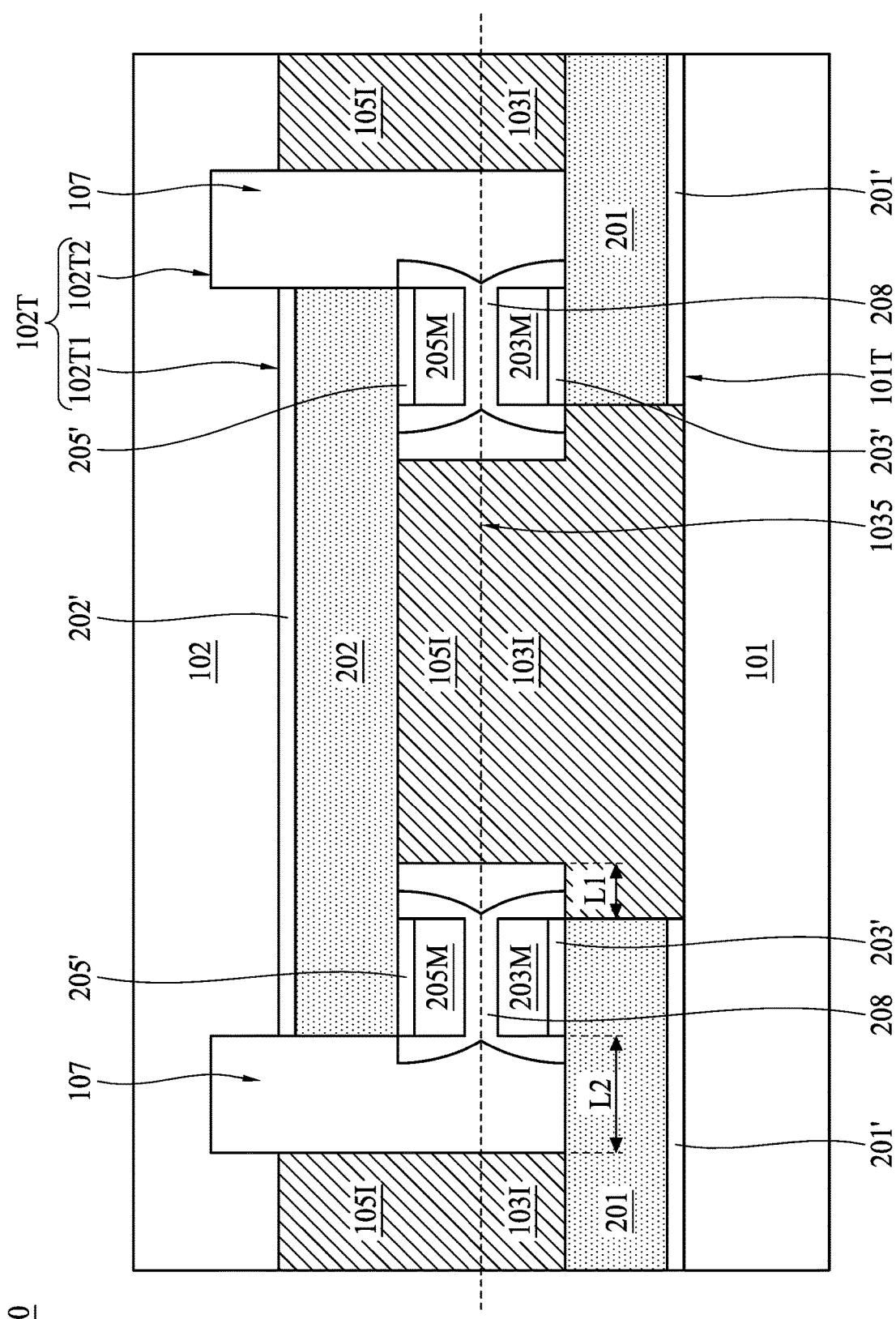
FIG. 2 illustrates a cross-sectional view of a semiconductor package according to some embodiments of the present disclosure.

FIG. 2 illustrates a cross-sectional view of a semiconductor package 20 according to some embodiments of the present disclosure. The semiconductor package 20 is similar to the semiconductor package 10C except for having an additional conducive pad 201 in the first trench 101T and an additional conductive pad 202 in the second trench 102T. In some embodiments, a seed layer 201' may be disposed between the first substrate 101 and the conductive pad 201 and a seed layer 202' may be disposed between the second substrate 102 and the conductive pad 202. Specifically, in some embodiments, the second trench 102T includes a shallower bottom level 102T1 and a deeper bottom level 102T2, and the conductive pad 202 is positioned on a shallower bottom level 102T1, receiving the metal protrusion 205M at both ends. The first trench 101T include a single bottom level and the conductive pad 201 is positioned on the bottom of the first trench 101T, receiving the metal protrusions 203M at both ends. In some embodiments, a seed layer 203' may be disposed between the conductive pad 201 and the metal protrusion 203M and a seed layer 205' may be disposed between the conductive pad 202 and the metal protrusion 205M. As shown in FIG. 2, the conductive pad 201, the metal protrusion 203M, the metal protrusion 205M, the conductive pad 202, and so on, form a daisy chain. Such daisy chain configuration allows in-situ electrical characterization (e.g., resistance measurement) during the electroless plating operation, thereby probing the progress of the deposition of the electroless-plated portion 208.

A boundary 1035 between the insulating protrusion 103I and insulating protrusion 105I can be observed because prior to the electroless plating operation, the insulating protrusion 103I and the insulating protrusion 105I form an abutted junction while a gap, for example, less than 5 µm, is preserved between the opposing ends of the metal protrusion 203M and the metal protrusion 205M. As a result, the boundary is at a level higher than the top surface of the metal protrusion 203M, and lower than the surface of the metal protrusion 205M opposing to the metal protrusion 203M.

Referring to FIG. 2, the metal protrusion 203M in the first trench 101T is spaced apart from the insulating protrusion 103I from a left side and a right side. A distance L1 is between the right side of the metal protrusion 203M and the opposing side of the insulating protrusion 103I, and a distance L2 is between the left side of the metal protrusion 203M and the opposing side of the insulating protrusion 103I. In some embodiments, the distance L1 is different from the distance L2. For example, the distance L1 may be smaller than the distance L2. In some embodiments, the electroless plated portion 208 at the right side of the metal protrusion 203M may be in contact with the opposing sidewall of the insulating protrusion 103I to its right while still spaced from the opposing sidewall of the insulating protrusion 103I to its left. In a device with high density I/O counts, the insulating protrusion 103I may function as a spacer preventing the electroless plated portion 208 of a metal protrusion 203M from bridging to the electroless plated portion 208 of an adjacent metal protrusion 203M.

Figure 3:
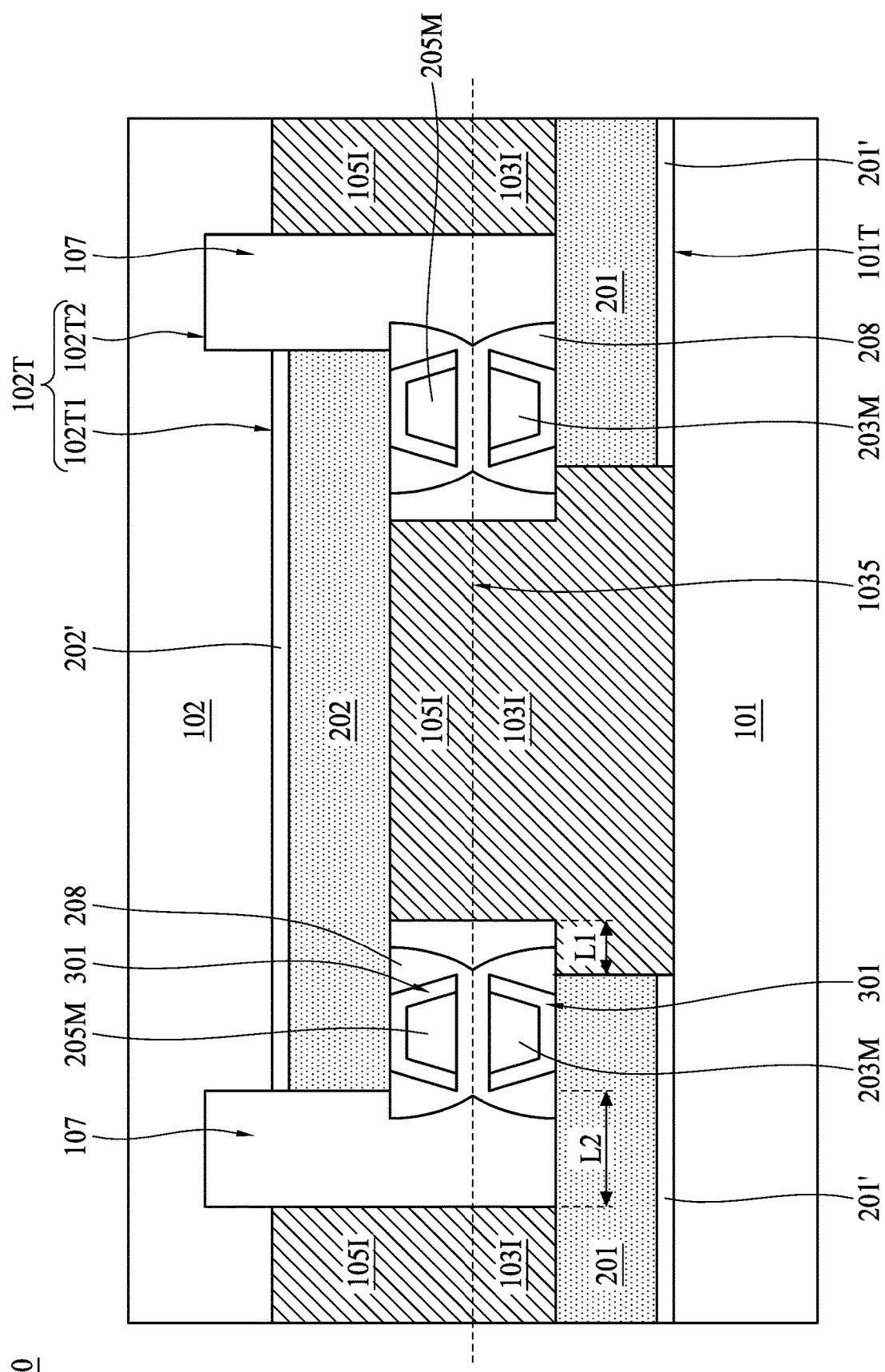
FIG. 3 illustrates a cross-sectional view of a semiconductor package according to some embodiments of the present disclosure.

FIG. 3 illustrates a cross-sectional view of a semiconductor package 30 according to some embodiments of the present disclosure. The semiconductor package 30 is similar to the semiconductor package 20 except that the metal protrusion 203M in the trench 101T and the metal protrusion 205M in the trench 102T each has a tapered shape. The metal protrusion 203M has a narrower end in proximal to the conductive pad 201 and a wider end distal to the conductive pad 201. In some embodiments, a seed layer 301 lines the bottom and sidewall contour of the tapered metal protrusion 203M and metal protrusion 205M.

Figure 4:
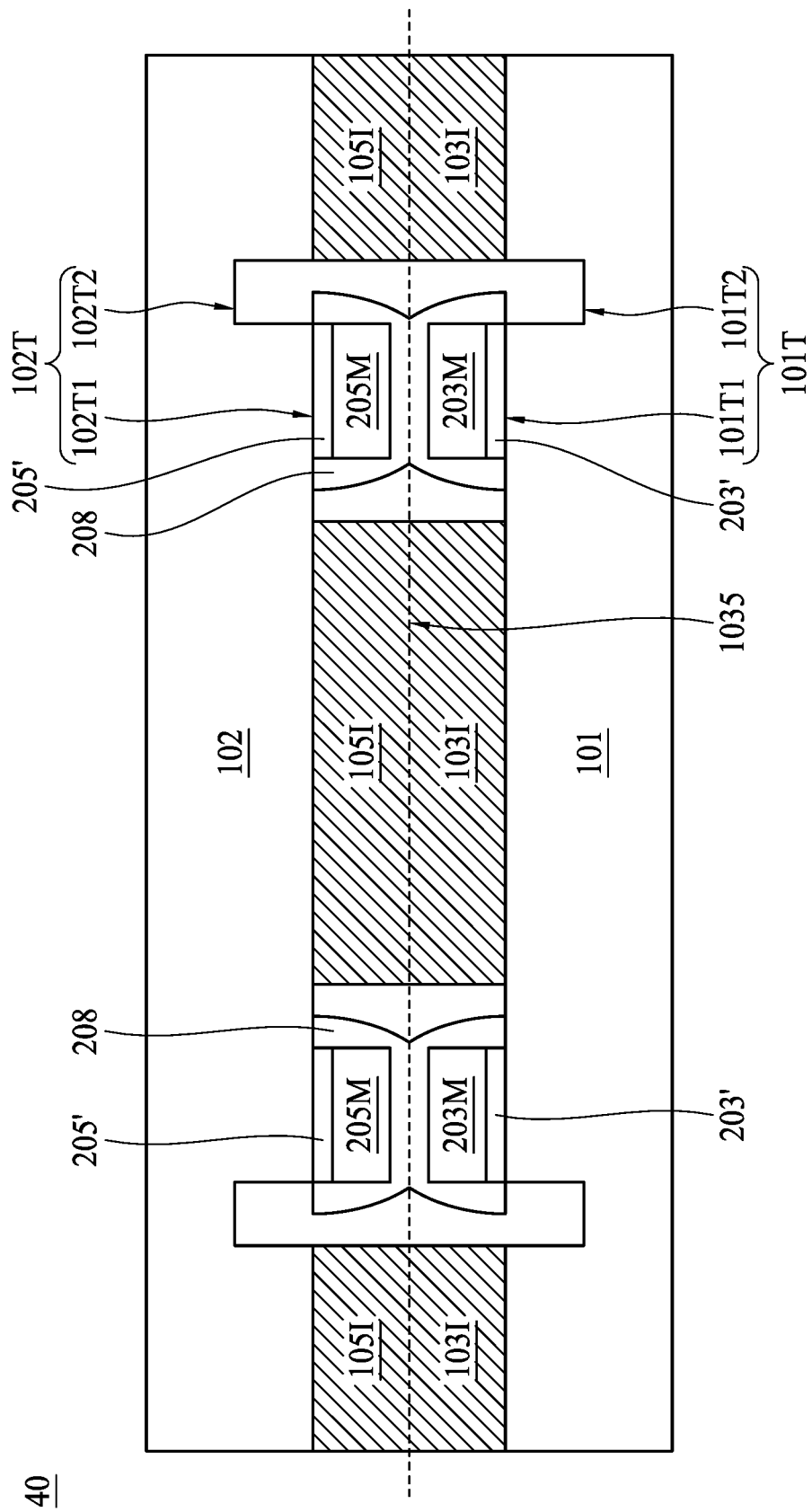
FIG. 4 illustrates a cross-sectional view of a semiconductor package according to some embodiments of the present disclosure.

FIG. 4 illustrates a cross-sectional view of a semiconductor package 40 according to some embodiments of the present disclosure. The semiconductor package 40 is similar to the semiconductor package 10C except that, similar to the second trench 102T, the bottom of the first trench 101 includes different levels, for example, the first trench 101T includes a shallower bottom level 101T1 and a deeper bottom level 101T2, and the metal protrusion 203M is positioned on the shallower bottom level 101T1. Depending on the layout and depth of the active regions, some of the semiconductor dies may allow a deeper recess toward a passive surface of the substrate, while some of the semiconductor dies may only accommodate a shallower recess toward the passive surface of the substrate. The bottom levels 101T1, 101T2, 102T1, and 102T2 may be adjusted according to the active region arrangement of different semiconductor dies. Deeper level of the trench bottom toward the passive surface allows greater volume of the fluid to pass the metal protrusions 203M and 205M during electroless plating operation, so as to facilitate the process especially when high viscosity fluid is used.

Figure 5:
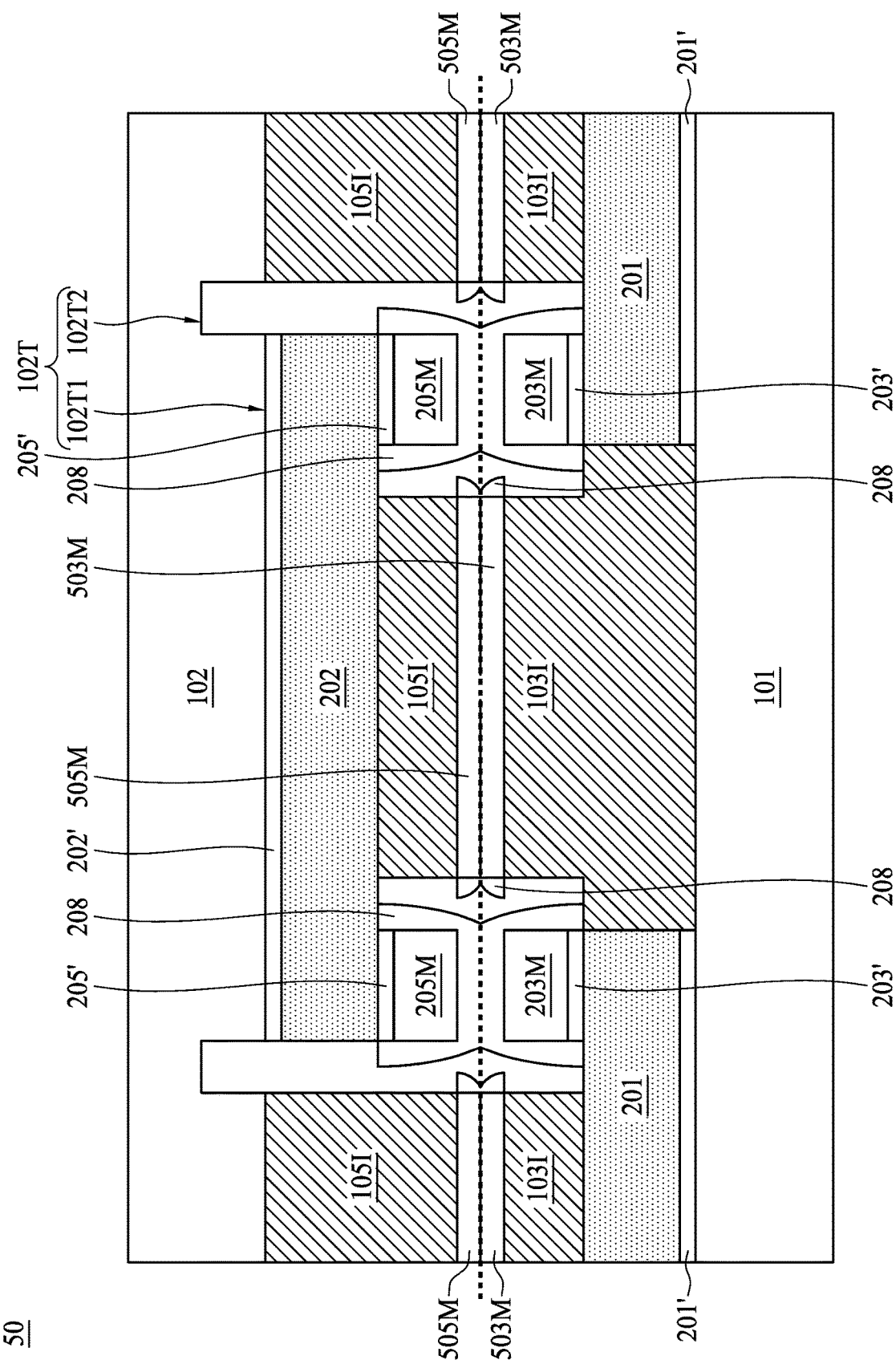
FIG. 5 illustrates a cross-sectional view of a semiconductor package according to some embodiments of the present disclosure.

FIG. 5 illustrates a cross-sectional view of a semiconductor package 50 according to some embodiments of the present disclosure. The semiconductor package 50 is similar to the semiconductor package 20 except that a conductive layer 503M is disposed on the insulating protrusion 103I of the first substrate 101 and a conductive layer 505M is disposed on the insulating protrusion 105I of the second substrate 102. As a result, the electroless-plated portion 208 is electrically connecting the metal protrusions 203M, 205M, as well as the conductive layers 503M, 505M. Unlike the semiconductor package 20, the insulating protrusions 103I, 105I of the semiconductor package 50 are not in direct contact. Electroless plating operations can be conducted with the assistance of a fixture mechanism that fixates the first substrate 101 and the second substrate 102 at a sufficiently close distance so as to facilitate the bridging of the electroless-plated portion 208 between the metal protrusions 203M, 205M, as well as the conductive layers 503M, 505M. In some embodiments, the opposing surfaces of the insulating protrusion 103I, 105I may not need to be planarized before forming the conductive layers 503M, 505M.

Figure 6:
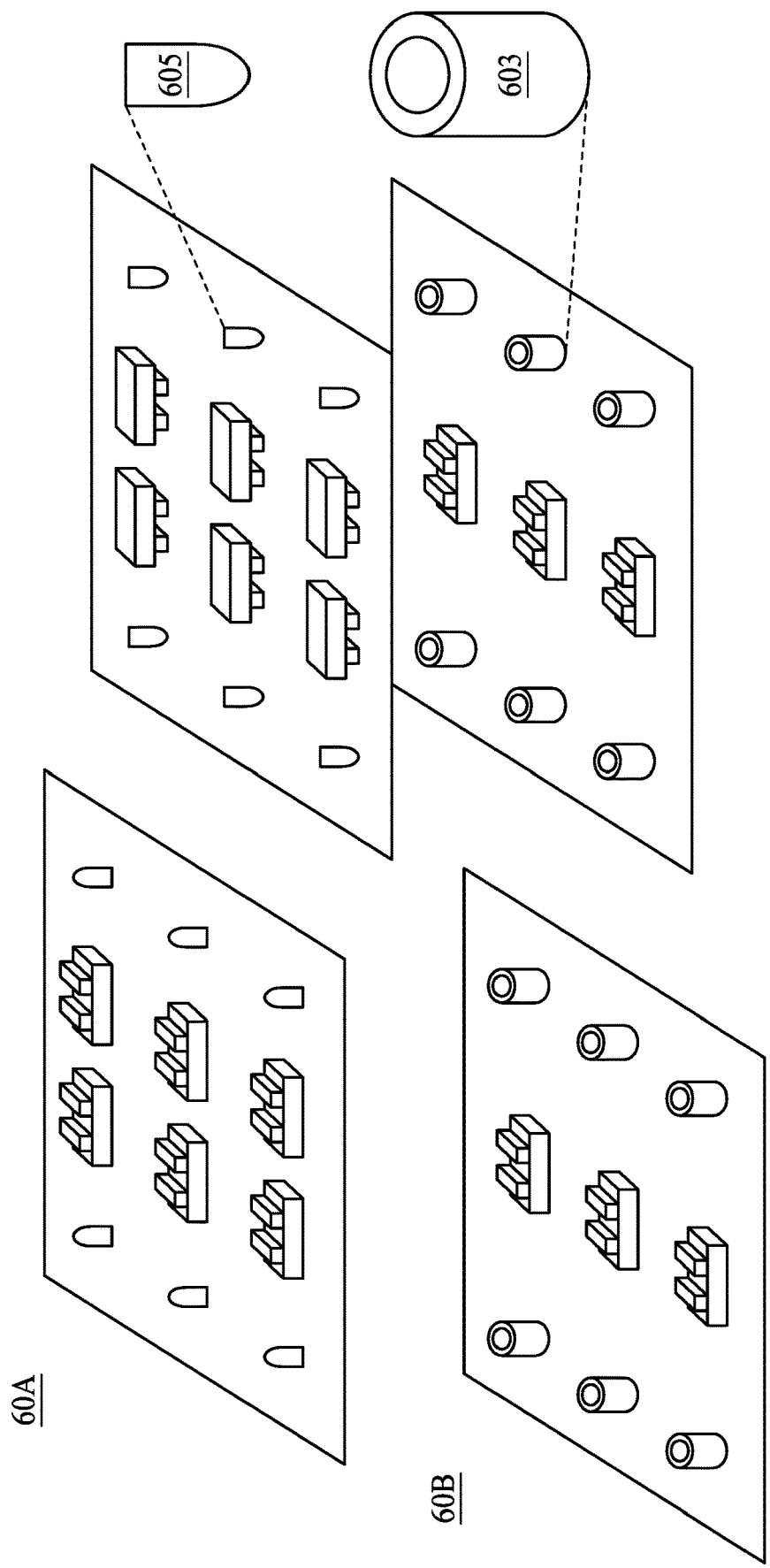
FIG. 6 illustrates a perspective view of a semiconductor package prior to bonding a first substrate and a second substrate opposing to the first substrate, and a box-to-pin connector according to some embodiments of the present disclosure.

FIG. 6 illustrates a perspective view of a semiconductor package prior to bonding a first substrate 60A and a second substrate 60B opposing to the first substrate 60A, and a box-to-pin connector according to some embodiments of the present disclosure. Prior to forming the electroless-plated portion 208, the first substrate 101 and the second substrate 102 are bonded through the insulating protrusions 103I, 105I. In order to enhance the bonding force, a fixating element can be further disposed in both of the trenches 101T, 102T. For example, a box element 603 can be disposed, for example, in the first trench 101T, and a pin element 605 can be disposed in the second trench 102T, corresponding to the location of the box element 603. The box element 603, as illustrated in FIG. 6, may be a hollow cylindrical construct, and the pin element 605 may be a rod-like construct loosely fit into the box element 603. Alternatively stated, a radius of the pin element 605 is smaller than a radius of the box element 603 to an extent that a seam may exist after fitting the pin element 605 into the box element 603.

When bonding the first substrate 101 and the second substrate 102, the pin element 605 and the box element 603 are loosely fitted, while the insulating protrusions 103I, 105I are in direct contact and forming molecular level bonding. During the electroless plating operation, the electroless-plated portion 208 is deposited between the opposing metal protrusions 203M, 205M, as well as in the seam between the pin element 605 into the box element 603. At the completion of the electroless plating operation, the box-and-pin mechanism provides extra mechanical bonding due to the fact that the electroless-plated portion 208 has filled the gap or seam between the pin element 605 into the box element 603.

Figure 7:
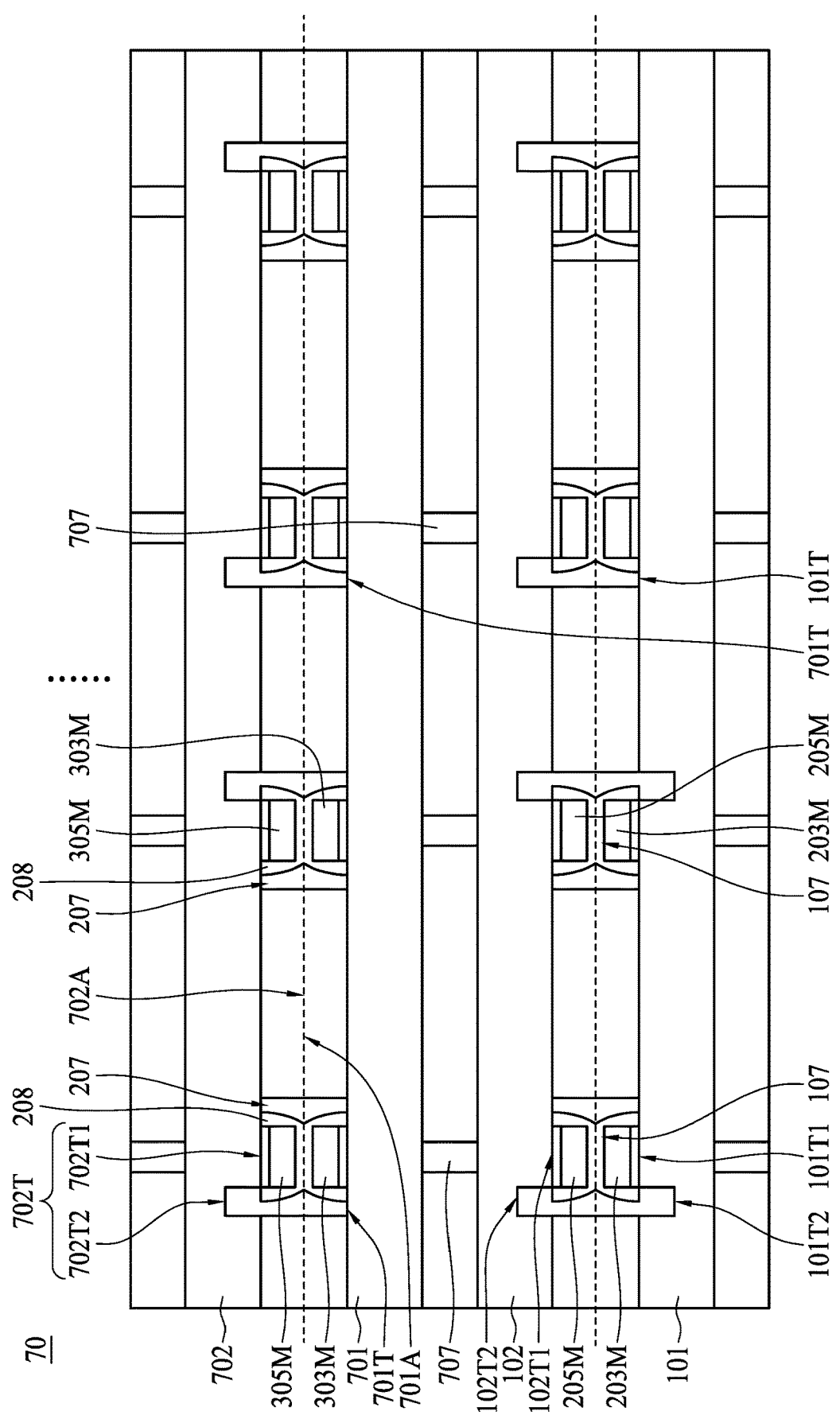
FIG. 7 illustrates a cross-sectional view of a semiconductor package having a multi-layer stacking structure according to some embodiments of the present disclosure.

FIG. 7 illustrates a cross-sectional view of a semiconductor package 70 having a multi-layer stacking structure according to some embodiments of the present disclosure. The semiconductor package 70 is similar to the semiconductor package 40 except that a third substrate 701 and a forth substrate 702 are stacked over the first substrate 101 and the second substrate 102. Similarly, the third substrate 701 has a trench 701T recessed from a third active surface 701A, and the fourth substrate 702 has a trench 702T recessed from a fourth active surface 702A. A second pathway cavity 207, or the second fluid pathway, is defined by the trench 701T and the trench 702T after the third substrate 701 and the fourth substrate 702 are bonded. A metal protrusion 303M is disposed in the third trench 701T, and a metal protrusion 305M is disposed in the fourth trench 702T. In some embodiments, the metal protrusion 303M is electrically connected to the metal protrusion 305M through the electroless-plated portion 208. In some embodiments, the metal protrusions 303M, 305M are electrically connected to the first substrate 101 and the second substrate 102 by a thorough via 707 in the second substrate 102 or the third substrate 701.

As illustrated in FIG. 7, in some embodiments, the first substrate 101 may include trenches 101T with various bottom levels. Depending on the layout and depth of the active regions, some of the semiconductor dies may allow a deeper recess toward a passive surface of the substrate in a predetermined region, while some of the semiconductor dies may only accommodate a shallower recess toward the passive surface of the substrate in other predetermined regions. In some embodiments, the third substrate 701 may include trenches 701T with a single bottom level.

Figure 8G:
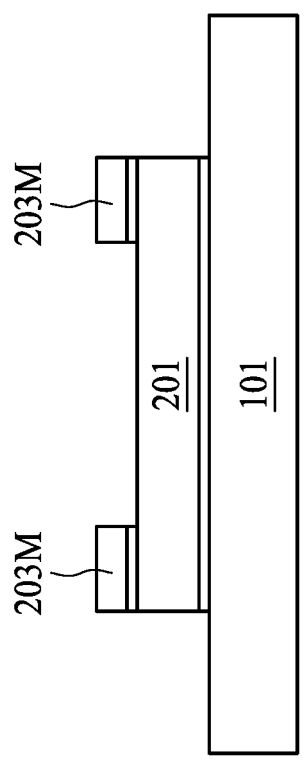

FIG. 8A to FIG. 8J illustrate cross sectional views of intermediate products in various stages of manufacturing a semiconductor package, according to some embodiments of the present disclosure. In FIG. 8A, a first substrate 101 is provided. The first substrate has an active surface, and a seed layer 800, for example, a physical vapor deposition (PVD) Ti/Cu layer is formed over the active surface. In FIG. 8B, a conducive pad 201 is formed over the active surface of the first substrate 101 with a photolithography operation, for example, a patterned photoresist 801 is formed prior to an electrochemical deposition of copper. In FIG. 8C, the photoresist 801 is removed, exposing the seed layer 800 not covered by the conductive pad 201. In FIG. 8D, the exposed seed layer 800 is removed, and a patterned photoresist 802 is formed over the active surface and the conductive pad 201, as illustrated in FIG. 8E. A seed layer 803, or a PVD Ti/Cu layer, is formed on the conductive pad 201 not covered by the patterned photoresist 802, as well as the top surface of the patterned photoresist 802.

Figure 8H:
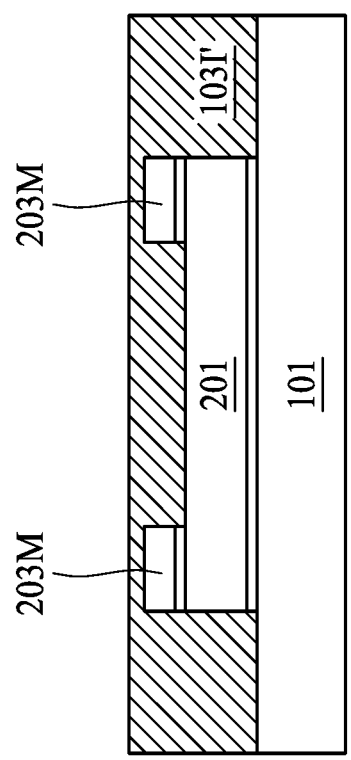
Figure 8I:
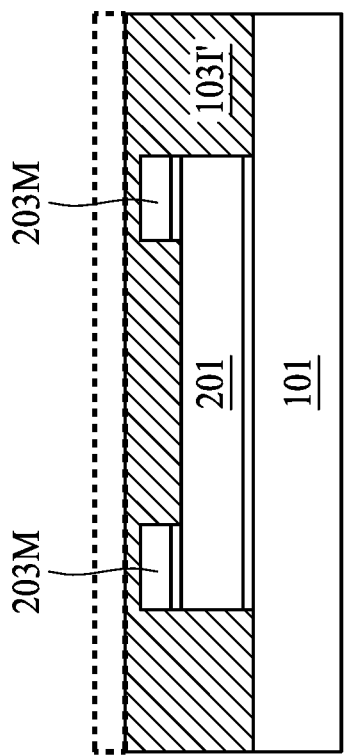
Figure 8J:
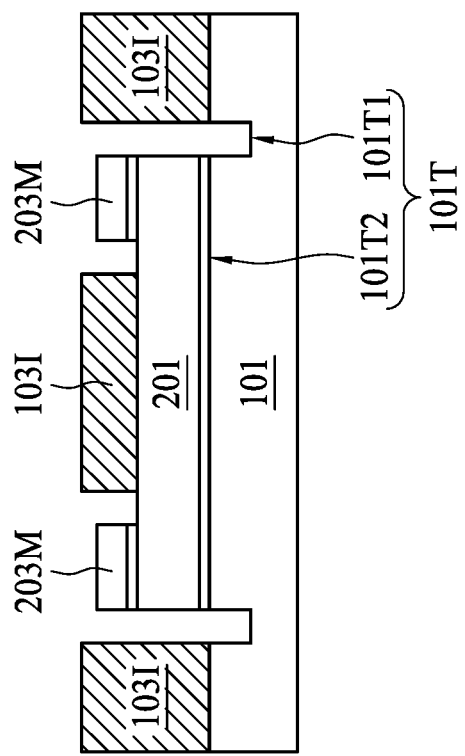

In FIG. 8F, a pair of metal protrusions 203M are formed over both ends of the conductive pad 201, i.e., in the opening of the patterned photoresist 802 by an electrochemical deposition of copper. In FIG. 8G, the patterned photoresist 802 and the seed layer 803 are removed through a lift off operations. In FIG. 8H, a dielectric layer 103I' is formed over the active surface of the substrate 101, the conductive pad 201, and the pair of metal protrusions 203M. In some embodiments, the dielectric layer 103I' is deposited via a silicon oxide chemical vapor deposition (CVD) operation. A top surface of the dielectric layer 103I' should cover the top surface of the pair of the metal protrusions 203M. In FIG. 8I, a planarization operation, for example, a chemical mechanical polishing (CMP) operation, is performed to planarize and to remove a portion of the dielectric layer 103I' to an extent that the top surface of the pair of the metal protrusions 203M are still covered by a thin layer of dielectric. In FIG. 8J, a trench 101T is formed in the first substrate 101 and the dielectric layer 103I' by a dry etch operation. A top surface and a side surface of the pair of metal protrusions 203M are exposed to the trench 101T after the dry etch operation. The metal protrusion 203M and the insulating protrusion 103I are staggerly disposed. Note the top surface of the insulating protrusion 103I is higher than the top surface of the metal protrusion 203M after the dry etching operation.

Figure 8K:
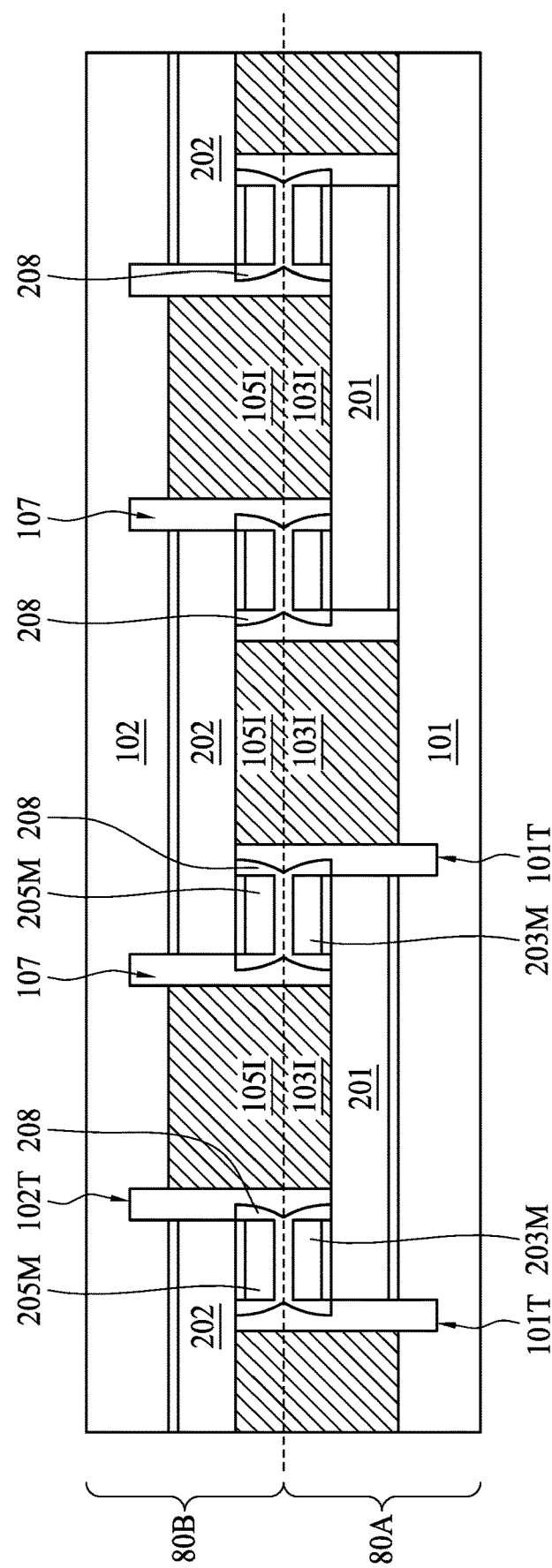
FIG. 8K illustrates a cross sectional view of a semiconductor package assembled by the structure in FIG. 8J according to some embodiments of the present disclosure.

FIG. 8K illustrates a cross sectional view of a semiconductor package assembled by the structure in FIG. 8J according to some embodiments of the present disclosure. FIG. 8J shows a first die 80A having the trench 101T, the conductive pad 201, and the metal protrusions 203M. In FIG. 8K, a second die 80B having the trench 102T, the conductive pad 202, and the metal protrusions 205M are flip bonded to the first die 80A, so as to define a semiconductor package with a plurality of pathway cavities 107. In some embodiments, the electrical connection, including the conductive pads 201, 202, the metal protrusions 205M, 203M, and the electroless-plated portion 208 are so designed to form a daisy chain arrangement in facilitating the in-situ electrical characterization (e.g., resistance measurement) during the electroless plating operation. However, in some embodiments, the electrical connection may be designed to form suitable arrangement other than a daisy chain. The operations adopted for forming the first die 80A may be duplicated on the forming of the second die 80B. Subsequently, an electroless plating operation is performed by flowing electroless plating solution in to the pathway cavity 107. The electroless-plated portion 208 may be deposited on the metal protrusions 203M, 205M and form electrical connection by bridging. In some embodiments, electroless plating solutions are selected according to temperature constraints for particular devices. For example, when the electroless plating temperature is to be controlled at about 80 degrees Celsius, electroless-plated portion 208 including nickel (Ni) may be selected. When the electroless plating temperature is to be controlled at about 50 degrees Celsius, electroless-plated portion 208 including gold (Au) or palladium (Pd) may be selected. When the electroless plating temperature is to be controlled at about 45 degrees Celsius, electroless-plated portion 208 including copper (Cu) may be selected.

In some predetermined regions of the first substrate 101, the trench 101T may recessed into the substrate (e.g., the left two trenches), while in other predetermined regions of the first substrate 101, the trench 101T may have a bottom substantially at the same level as the active surface of the first substrate 101 (e.g., the right two trenches). Depending on the layout and depth of the active regions, some of the semiconductor dies may allow a deeper recess into the substrate, while some of the semiconductor dies may only accommodate a shallower recess where the active surface of the substrate is substantially the bottom.

Figure 9A:
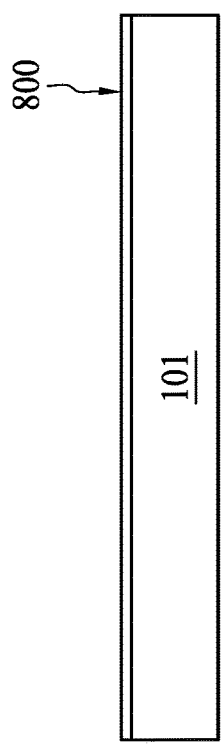
FIG. 9A to FIG. 9K illustrate cross sectional views of intermediate products in various stages of manufacturing a semiconductor package, according to some embodiments of the present disclosure.
Figure 9B:
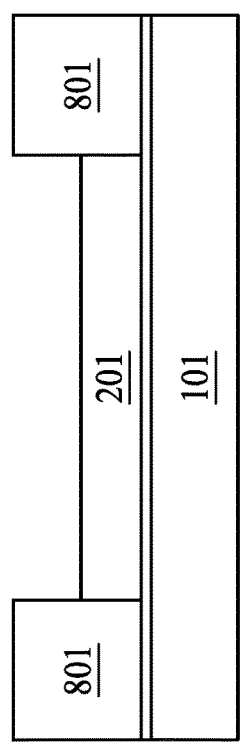
Figure 9C:
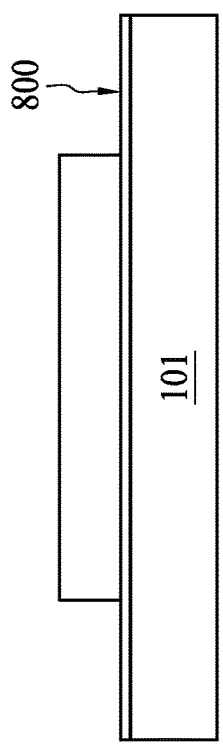
Figure 9D:
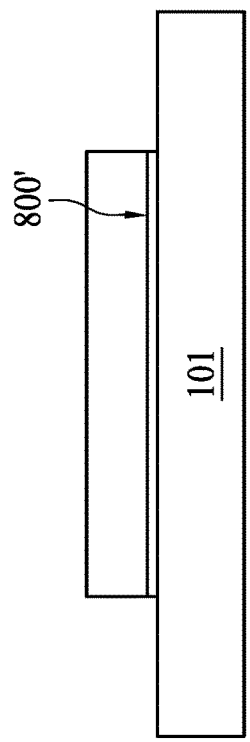
Figure 9E:
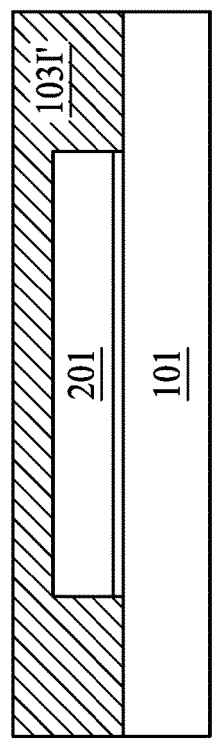
Figure 9F:
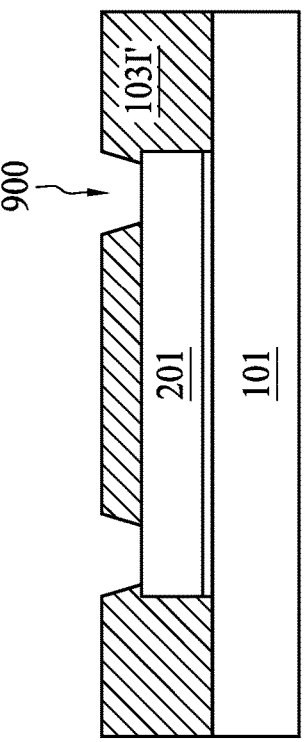
Figure 9J:
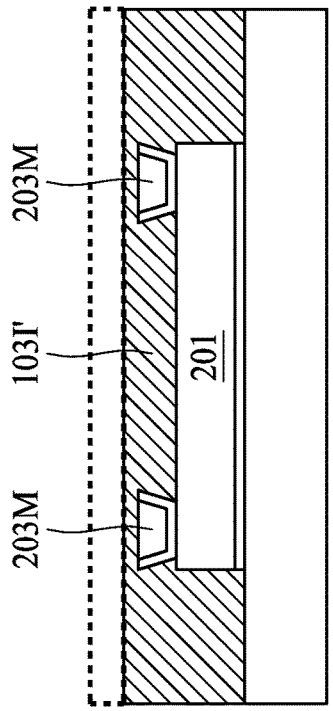
Figure 9K:
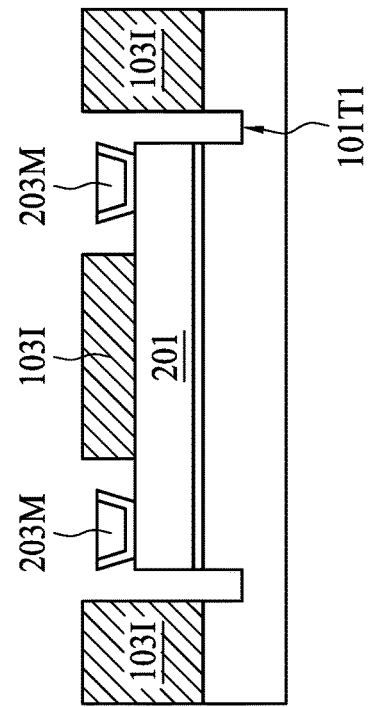
Figure 9G:
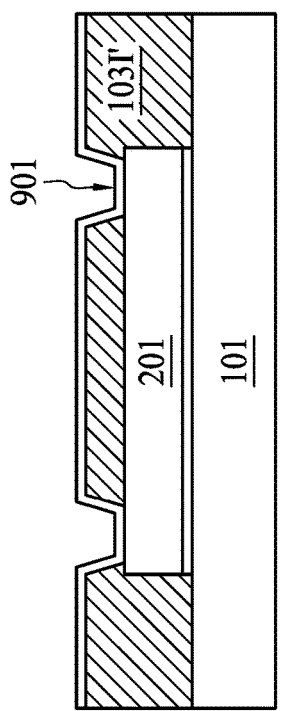

FIG. 9A to FIG. 9K illustrate cross sectional views of intermediate products in various stages of manufacturing a semiconductor package, according to some embodiments of the present disclosure. In FIG. 9A, a first substrate 101 is provided. The first substrate has an active surface, and a seed layer 800, for example, a physical vapor deposition (PVD) Ti/Cu layer is formed over the active surface. In FIG. 9B, a conducive pad 201 is formed over the active surface of the first substrate 101 with a photolithography operation, for example, a patterned photoresist 801 is formed prior to an electrochemical deposition of copper. In FIG. 9C, the photoresist 801 is removed, exposing the seed layer 800 not covered by the conductive pad 201. In FIG. 9D, the exposed seed layer 800 is removed, and a dielectric layer 103I' is deposited, for example, by a silicon oxide CVD, as illustrated in FIG. 9E. The dielectric layer 103I' is deposited to cover the top surface and the side surfaces of the conductive pad 201. In FIG. 9F, a pair of openings 900 are formed from the top surface of the dielectric layer 103I', exposing a portion of the underlying conductive pad 201. Subsequently, a seed layer 901, or a PVD Ti/Cu layer, is formed on the exposed portions of conductive pad 201, as well as contouring the surface of the dielectric layer 103I', as shown in FIG. 9G.

Figure 9H:
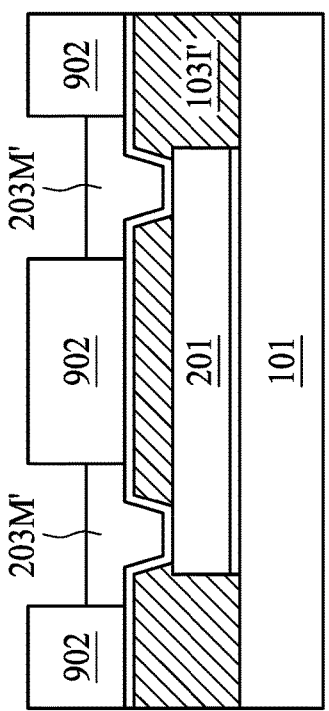
Figure 9I:
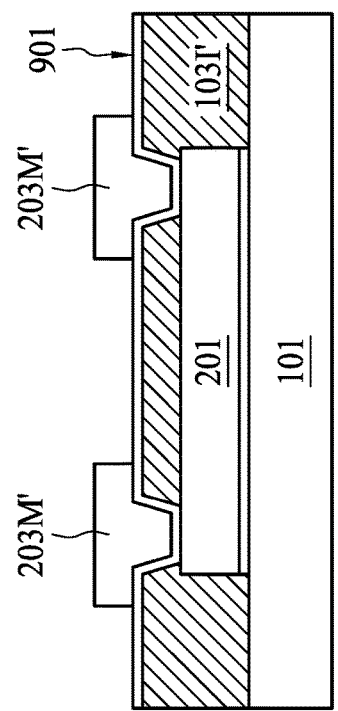

In FIG. 9H, a pair of metal protrusions 203M' is formed over the exposed portion of the conductive pad 201 with a photolithography operation, for example, a patterned photoresist 902 is formed prior to an electrochemical deposition of copper. In FIG. 9I, the patterned photoresist 902 is then removed, exposing the seed layer 901. In FIG. 9J, a planarization operation, for example, a chemical mechanical polishing (CMP) operation, is performed to remove a portion of the metal protrusion 203M' laid over the dielectric layer 103I' so as to planarize the metal surface and the dielectric surface. In some embodiments, the planarization operation may include multiples stages using different slurries which possess selectivity to different materials. For example, the last stage of the planarization may utilize a slurry having a greater selectivity to metal (e.g., copper) than to dielectric (e.g., silicon oxide), so that at the completion of the planarization, the planarized metal protrusions 203M is dishing toward the conductive pad 201 while the top surface of dielectric layer 103I' is at a higher level than the dished surface of the planarized metal protrusions 203M. In FIG. 9K, a trench 101T is formed in the first substrate 101 and the dielectric layer 103I' by a dry etch operation. A top surface and a side surface of the pair of metal protrusions 203M are exposed to the trench 101T after the dry etch operation. The metal protrusion 203M and the insulating protrusion 103I are staggerly disposed.

Figure 9L:
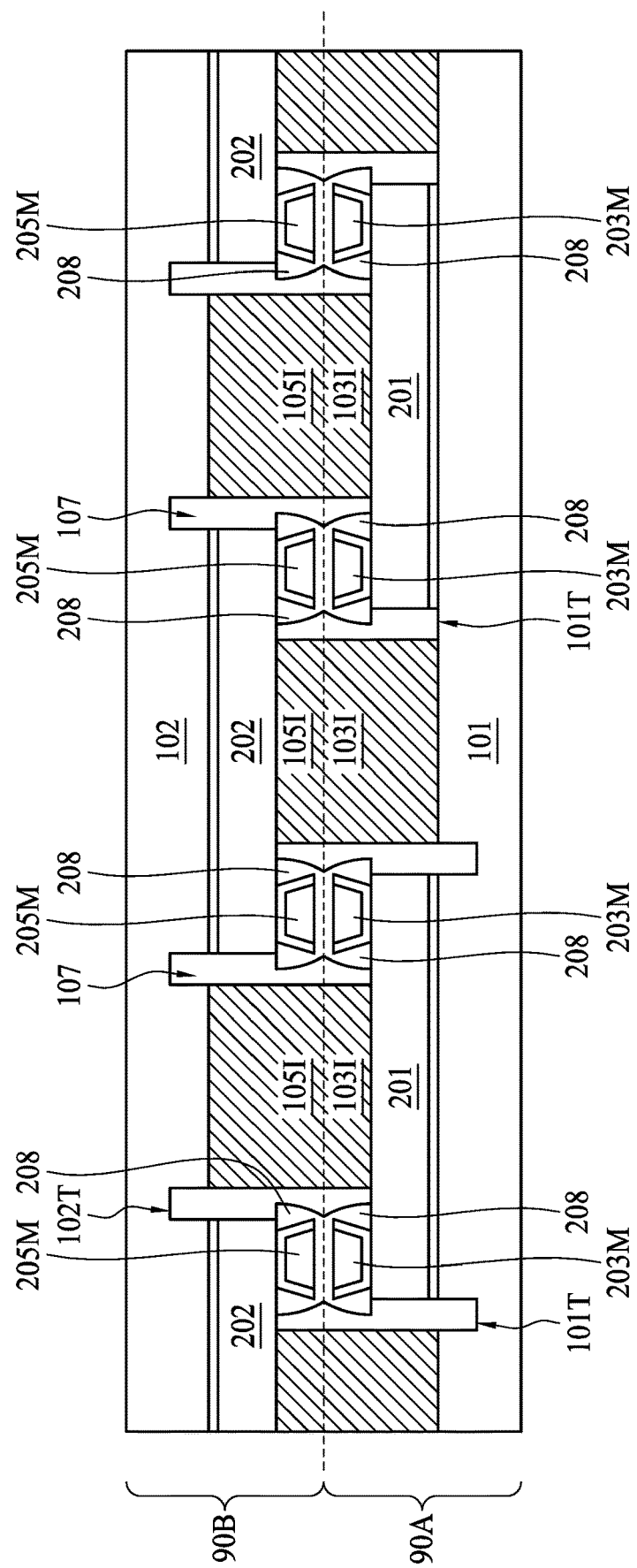
FIG. 9L illustrates a cross sectional view of a semiconductor package assembled by the structure in FIG. 9K according to some embodiments of the present disclosure.

FIG. 9L illustrates a cross sectional view of a semiconductor package assembled by the structure in FIG. 9K according to some embodiments of the present disclosure. FIG. 9L shows a first die 90A having the trench 101T, the conductive pad 201, and the metal protrusions 203M. In FIG. 9L, a second die 90B having the trench 102T, the conductive pad 202, and the metal protrusions 205M are flip bonded to the first die 90A, so as to define a semiconductor package with a plurality of pathway cavities 107. In some embodiments, the electrical connection, including the conductive pads 201, 202, the metal protrusions 205M, 203M, and the electroless-plated portion 208 are so designed to form a daisy chain arrangement in facilitating the in-situ electrical characterization (e.g., resistance measurement) during the electroless plating operation. However, in some embodiments, the electrical connection may be designed to form suitable arrangement other than a daisy chain. The operations adopted for forming the first die 90A may be duplicated on the forming of the second die 90B. Subsequently, an electroless plating operation is performed by flowing electroless plating solution in to the pathway cavity 107. The electroless-plated portion 208 may be deposited on the metal protrusions 203M, 205M and form electrical connection by bridging. In some predetermined regions of the first substrate 101, the trench 101T may recessed into the substrate (e.g., the left two trenches), while in other predetermined regions of the first substrate 101, the trench 101T may have a bottom substantially at the same level as the active surface of the first substrate 101 (e.g., the right two trenches). Depending on the layout and depth of the active regions, some of the semiconductor dies may allow a deeper recess into the substrate, while some of the semiconductor dies may only accommodate a shallower recess where the active surface of the substrate is substantially the bottom.

FIG. 10A to FIG. 10G illustrate cross sectional views of intermediate products in various stages of manufacturing a semiconductor package, according to some embodiments of the present disclosure. In FIG. 10A, a first substrate 101 is provided. The first substrate has an active surface, and a seed layer 800, for example, a physical vapor deposition (PVD) Ti/Cu layer is formed over the active surface. In FIG. 10B, a pair of metal protrusions 203M are formed over the active surface of the first substrate 101 with a photolithography operation, for example, a patterned photoresist 801 is formed prior to an electrochemical deposition of copper. In FIG. 10C, the photoresist 801 is removed, exposing the seed layer 800 not covered by the conductive pad 201. In FIG. 10D, the exposed seed layer 800 is removed. In FIG. 10E, a dielectric layer 103I' is deposited via a silicon oxide chemical vapor deposition (CVD) operation. A top surface of the dielectric layer 103I' should cover the top surface of the pair of the metal protrusions 203M. In FIG. 10F, a planarization operation, for example, a chemical mechanical polishing (CMP) operation, is performed to planarize and to remove a portion of the dielectric layer 103I' to an extent that the top surface of the pair of the metal protrusions 203M are still covered by a thin layer of dielectric. In FIG. 10G, a trench 101T is formed in the first substrate 101 and the dielectric layer 103I' by a dry etch operation. A top surface and a side surface of the pair of metal protrusions 203M are exposed to the trench 101T after the dry etch operation. The metal protrusion 203M and the insulating protrusion 103I are staggerly disposed. Note the top surface of the insulating protrusion 103I is higher than the top surface of the metal protrusion 203M after the dry etching operation.

Figure 10H:
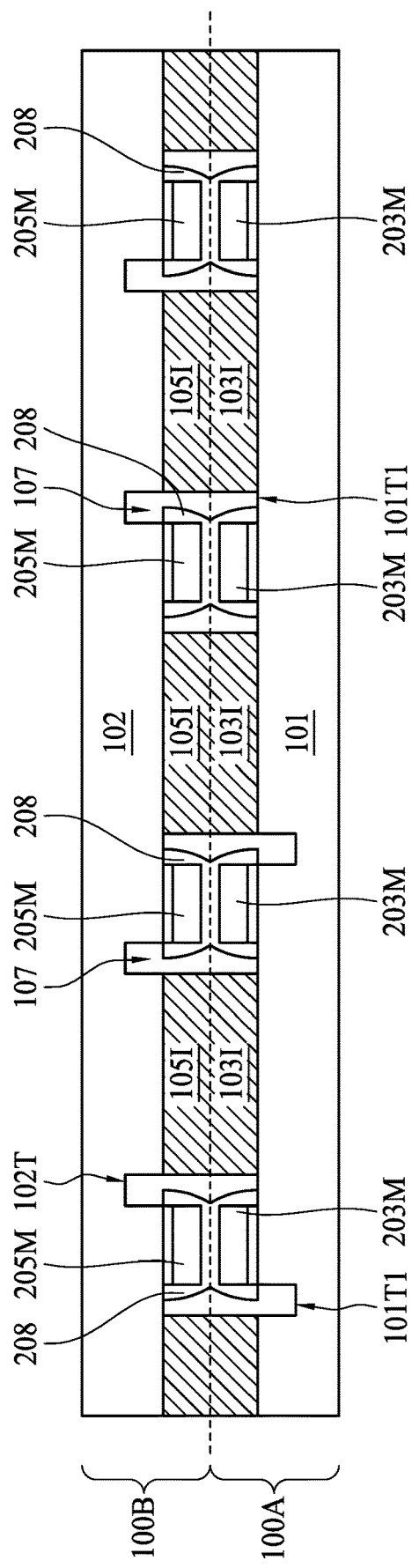
FIG. 10H illustrates a cross sectional view of a semiconductor package assembled by the structure in FIG. 10G according to some embodiments of the present disclosure.

FIG. 10H illustrates a cross sectional view of a semiconductor package assembled by the structure in FIG. 10G according to some embodiments of the present disclosure. FIG. 10H shows a first die 100A having the trench 101T and the metal protrusions 203M. In FIG. 10H, a second die 100B having the trench 102T and the metal protrusions 205M are flip bonded to the first die 100A, so as to define a semiconductor package with pathway cavity 107. The operations adopted for forming the first die 100A may be duplicated on the forming of the second die 100B. Subsequently, an electroless plating operation is performed by flowing electroless plating solution in to the pathway cavity 107. The electroless-plated portion 208 may be deposited on the metal protrusions 203M, 205M and form electrical connection by bridging. In some predetermined regions of the first substrate 101, the trench 101T may recessed into the substrate (e.g., the left two trenches), while in other predetermined regions of the first substrate 101, the trench 101T may have a bottom substantially at the same level as the active surface of the first substrate 101 (e.g., the right two trenches). Depending on the layout and depth of the active regions, some of the semiconductor dies may allow a deeper recess into the substrate, while some of the semiconductor dies may only accommodate a shallower recess where the active surface of the substrate is substantially the bottom.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a first substrate having a first active surface and a first trench recessed from the first active surface;
   a second substrate having a second trench facing the first trench; and
   a pathway cavity defined by the first trench and the second trench;
   wherein the first trench comprises a first metal protrusion and a first insulating protrusion, and the second trench comprises a second metal protrusion electrically coupling to the first metal protrusion and a second insulating protrusion connected to the first insulating protrusion.

2. The semiconductor package of claim 1, wherein the pathway cavity comprises a narrower width at an edge of the first substrate and a wider width at a center of the first substrate.

3. The semiconductor package of claim 1, further comprising an electroless-plated portion between the first metal protrusion and the second metal protrusion.

4. The semiconductor package of claim 1, further comprising a boundary between the first insulating protrusion and the second insulating protrusion, the boundary being at a level higher than a top surface of the first metal protrusion.

5. The semiconductor package of claim 1, wherein the first trench further comprises a plurality of metal protrusions and a plurality of insulating protrusions, each of the metal protrusions being staggerly disposed with respect to each of the insulating protrusions.

6. The semiconductor package of claim 1, further comprising:
   a first conductive pad in the first trench, the first metal protrusion and the first insulating protrusion being disposed on the first conductive pad; and
   a second conductive pad in the second trench, wherein the first conductive pad, the first metal protrusion, the second metal protrusion, and the second conductive pad form a daisy chain.

7. The semiconductor package of claim 1, wherein the second trench includes a shallower bottom level and a deeper bottom level and the second metal protrusion is disposed adjacent to the shallower bottom level.

8. The semiconductor package of claim 7, wherein the first trench includes a single bottom level and the first metal protrusion is disposed adjacent to the single bottom level.

9. The semiconductor package of claim 1, wherein a first distance from a first side of the first metal protrusion to a first side of the first insulating protrusion is different from a second distance from a second side of the first metal protrusion to a second side of the first insulating protrusion.

10. The semiconductor package of claim 9, further comprising an electroless-plated portion electrically connecting the first metal protrusion to the second metal protrusion, wherein the electroless-plated portion is in contact with the first side of the first insulating protrusion while spaced away from the second side of the first insulation protrusion.

11. The semiconductor package of claim 1, wherein the first metal protrusion has a tapered shape and includes a narrower end in proximal to the first substrate and a wider end distal from the first substrate.

12. The semiconductor package of claim 1, further comprising a conductive layer disposed between the first insulating protrusion and the second insulating protrusion.

13. A semiconductor package, comprising:
   a first substrate having a first active surface and a first trench recessed from the first active surface;
   a second substrate having a second trench facing the first trench;
   a first fluid pathway defined by the first trench and the second trench; and a plurality of conductive elements and a plurality of insulating portions in the first fluid pathway, and each of the conductive elements being staggerly disposed with respect to each of the insulating portions.

14. The semiconductor package of claim 13, wherein one of the conductive elements comprises a first metal protrusion extending from the first trench, a second metal protrusion extending from the second trench, and an electroless-plated portion connecting the first metal protrusion and the second metal protrusion.

15. The semiconductor package of claim 13, wherein the second trench comprises two bottom levels.

16. The semiconductor package of claim 13, further comprising:
a box-to-pin connector in the first fluid pathway.

17. The semiconductor package of claim 13, further comprising:
a third substrate having a third active surface and a third trench recessed from the third active surface, wherein the third substrate is stacked over and electrically coupling to the first substrate and the second substrate.

18. The semiconductor package of claim 17, further comprising:
a fourth substrate having a fourth trench facing the third trench; and
a second fluid pathway defined by the third trench and the fourth trench.

19. The semiconductor package of claim 17, wherein the third substrate electrically couples to the first substrate and the second substrate by a through via in the second substrate.

* * * * *